(12) United States Patent
Li et al.

(10) Patent No.: US 7,320,945 B2
(45) Date of Patent: Jan. 22, 2008

(54) GRADIENT LOW K MATERIAL

(75) Inventors: Lih-Ping Li, Hsin-Chu (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 295 days.

(21) Appl. No.: 10/881,700

(22) Filed: Jun. 30, 2004

(65) Prior Publication Data
US 2006/0003598 A1    Jan. 5, 2006

(51) Int. Cl.
*H01L 21/31*    (2006.01)
(52) U.S. Cl. ...................... 438/789; 438/623
(58) Field of Classification Search ............... 438/623, 438/638, 687, 692, 694, 700, 780, 787–790; 257/759, E51.027, E23.119, E21.242, E21.243, 257/E21.244, E21.274
See application file for complete search history.

(56) References Cited

U.S. PATENT DOCUMENTS 6,992,003 B2 *    1/2006    Spencer et al. ............. 438/638

* cited by examiner

*Primary Examiner*—David Vu
(74) *Attorney, Agent, or Firm*—Slater & Matsil, L.L.P.

(57) ABSTRACT

A thin film dielectric layer comprises a top portion and a bottom portion and has density and permittivity characteristics that vary substantially uniformly from the top portion to the bottom portion. Control over the density and/or permittivity is accomplished through varying deposition parameters such as flow rate of constituent process gases or deposition chamber pressure, or through a post deposition treatment, such as plasma treatment or curing.

6 Claims, 4 Drawing Sheets

Distance from Bottom

Distance from Bottom

GRADIENT LOW K MATERIAL

FIELD OF THE INVENTION

This invention relates generally to the formation of low permittivity dielectric materials and more particularly to the formation of a low permittivity dielectric layer having a gradient permittivity constant across the thickness of the layer and structures fabricated using same.

BACKGROUND

As semiconductor device integration continues to advance, device geometries continue to shrink. Smaller device geometries require thinner thin film layers used in the manufacture of those devices, including thinner dielectric layers. As device density becomes greater and dielectric layers become thinner, inter-level parasitic capacitance becomes an increasingly significant problem in terms of device performance.

Prior art approaches to reduce parasitic capacitance include the use of low permittivity or so-called low k dielectric materials. Typically, materials having a permittivity value below that of silicon oxide ($SiO_2$), i.e., about 3.9, are termed low k dielectrics. Such low k dielectrics used in lieu of traditional dielectric materials can lessen the capacitance between, e.g., metal interconnects.

Low k dielectrics suffer from several disadvantages, however. One of the foremost disadvantages is that low k dielectric materials tend to have poor mechanical properties, such as poor adhesion and poor mechanical strength. These shortcomings result in diminished device yield, reliability, and overall performance.

What is needed, therefore, is a low k dielectric material that overcomes the mechanical shortcomings of traditional low permittivity dielectrics.

SUMMARY OF THE INVENTION

In one aspect, the present invention provides for a thin film dielectric layer comprising a top portion and a bottom portion, the dielectric layer having a density that varies substantially uniformly from the top portion to the bottom portion.

In another aspect, the present invention provides for a method of forming a dielectric layer on a substrate. The method includes beginning a chemical vapor deposition of a dielectric material on the substrate by introducing at least two gases to the substrate and varying the flow rate ratio of the at least two gases during deposition of the dielectric material so as to substantially uniformly vary the concentration of at least one of the at least two gases in the resulting dielectric layer.

In yet another aspect, the present invention provides for a method of forming a dielectric layer. The method includes forming a dielectric layer over a substrate and exposing the top surface of said dielectric layer to a plasma. The plasma exposure continues until the dielectric layer has a desired density profile.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
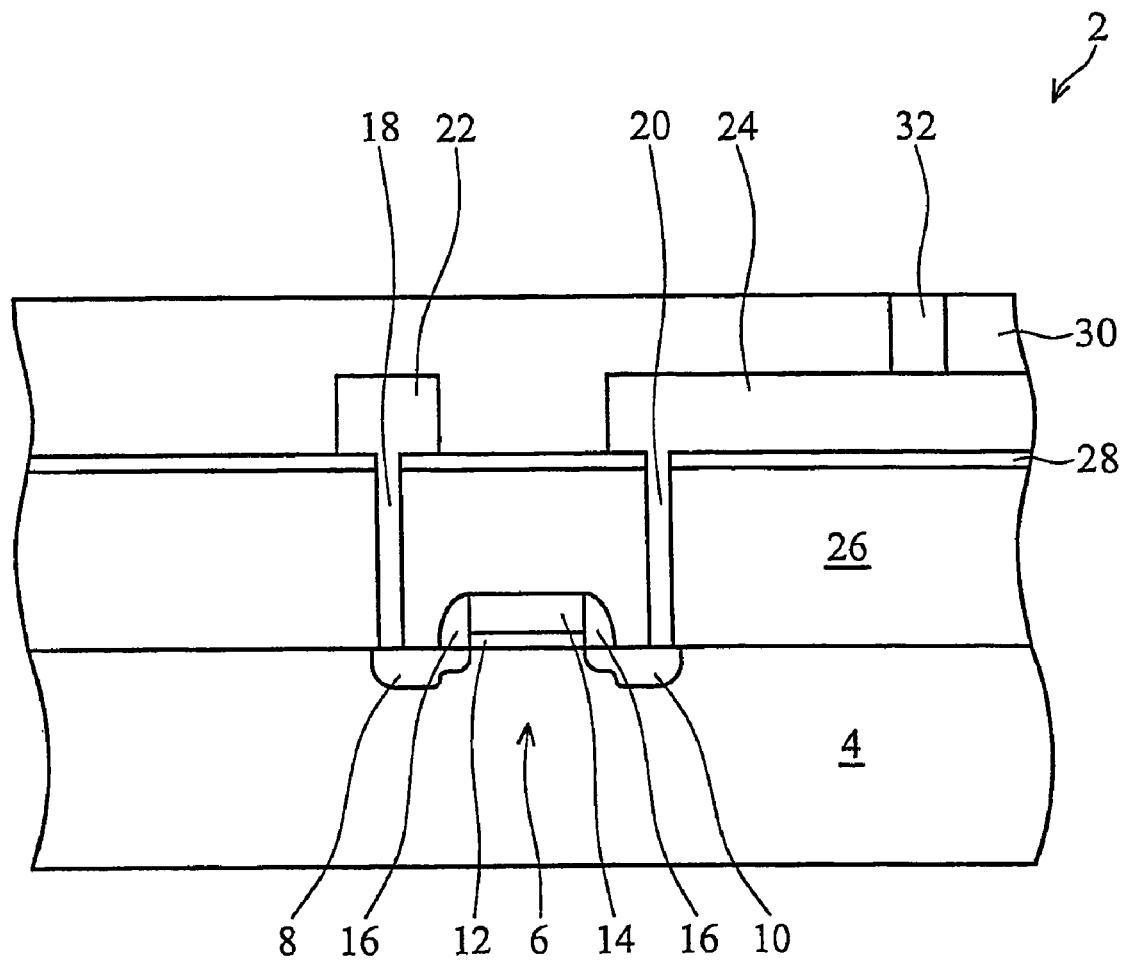
FIG. 1 illustrates a prior art semiconductor device.

FIG. 1 schematically illustrates a representative integrated circuit 2 including a MOSFET device 6 formed on a substrate 4. The substrate 4 may be a conventional bulk substrate, such as a single crystal silicon wafer, or may be a semiconductor layer, such as silicon, silicon-germanium, or the like, formed over a buried oxide layer (not shown), which in turn is formed over a supporting substrate of, e.g., silicon, quartz, glass, or the like (i.e., a silicon on insulator, or SOI, substrate). MOSFET 6 comprises a source 8 and drain 10 region formed in substrate 4 and defining a channel region therebetween. MOSFET 6 further comprises a gate electrode 14 overlying the channel region and separated therefrom by gate dielectric 12, as is well known in the art. Typically, gate spacers 16 are formed adjacent gate electrode 14 and are used in the formation of source and drain regions 8 and 10, respectively, as is known in the art.

FIG. 1 also illustrates electrical connections to the source and drain regions 8 and 10, respectively, in the form of contacts 18 and 20, respectively, making electrical contact to source and drain regions 8 and 10, respectively, and to metal interconnects 22 and 24, respectively. Dielectric layer 26 overlies MOSFET 6 and electrically insulates the device from subsequently formed elements, including metal interconnects 22 and 24 (except where it is desired to electrically couple the device, such as provided by contacts 18 and 20). Dielectric layer 26 is commonly referred to as an inter-level dielectric layer (ILD). In some embodiments, particularly in those embodiments wherein metal interconnects 22 and 24 are formed using a damascene or dual damascene process, dielectric layer 26 will also serve to support the interconnects. In a conventional device, ILD layer 26 is typically formed of silicon oxide or the like. Regardless of the material used, the layer will be substantially homogenous and have substantially uniform material properties throughout its thickness.

ILD layer 26 may also include an etch stop layer, such as etch stop layer 28. This etch stop layer serves to aid in the formation of vias and trenches within subsequently formed dielectric layers, as will be explained in greater detail below. In some instances, ILD layer 26 may be comprised on two or more discrete sub-layers.

Also shown in FIG. 1 is inter-metal dielectric layer (IMD) 30. IMD layer 30 serves to electrically isolate interconnects 22, 24 from subsequently formed interconnects (not shown), except where it is desired to electrically couple the interconnects, such as through via 32 which electrically couples interconnect 24 to a subsequently formed, overlying interconnect (not shown). IMD layer 30 may also comprise two or more discrete sub-layers. IMD layers are typically formed from the same category of materials (i.e., low k dielectrics) as used in forming the ILD layers, but typically the ILD layer is comprised of a different material than the IMD layer, due to different requirements for performance, processing, and the like between the two layers. Like the ILD layers, conventional IMD layers are substantially uniform in their mechanical and material properties throughout their thickness.

Figure 2:
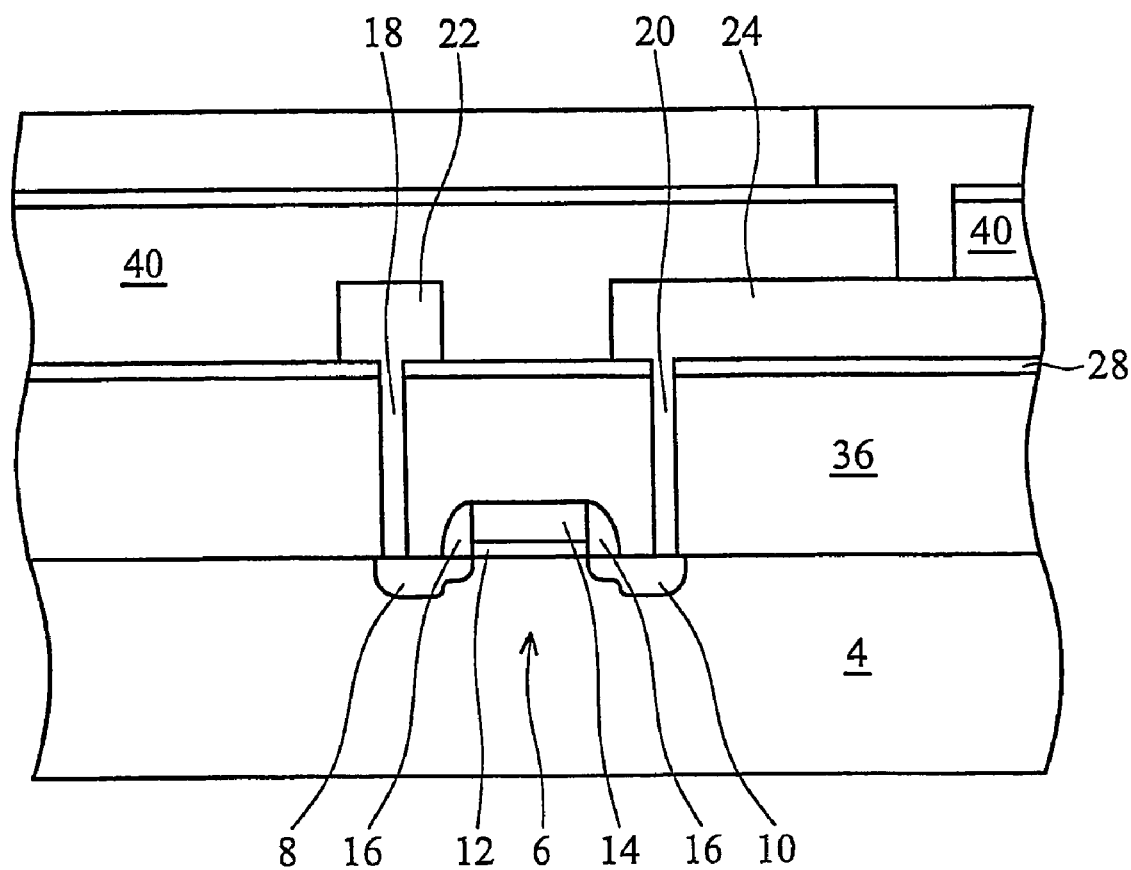
FIG. 2 illustrates a semiconductor device embodying illustrative features of the present invention.
Figure 3:
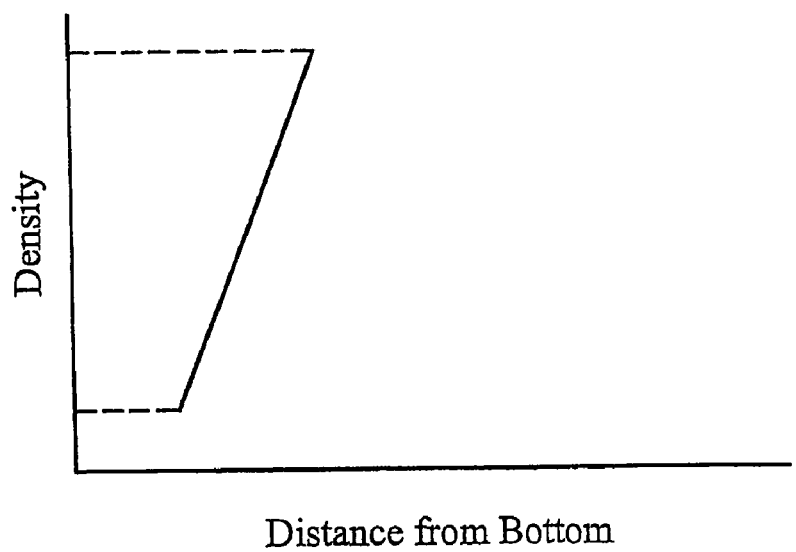
FIG. 3 illustrates a density profile of an illustrative embodiment dielectric layer.

FIG. 2 illustrates an illustrative embodiment of the present invention in which IMD layer 40 is formed having a substantially continuously varying permittivity value over its thickness. FIG. 3 graphically illustrates the permittivity of layer 40 as one proceeds from the bottommost region of layer 40, where the layer is adjacent interconnects 22 and 24 and etch stop layer 28, to the uppermost region of layer 40, where the layer is adjacent subsequently formed interconnects (not shown) and/or a subsequently formed etch stop layer (also not shown). As FIG. 3 illustrates, proceeding from the bottom of layer 40 to the top, the density of the layer gradually increases from about 1.2 g/cm3 to about 1.5 g/cm3. Density is proportional to permittivity (i.e., as the film density increases, the permittivity also increases). The resulting layer 36 provides for the advantageous features of low permittivity, while at the same time providing for improved mechanical strength and performance over traditional low permittivity dielectric layers. ILD layer 36 can also be formed using similar techniques to obtain a substantially continuously varying permittivity, as will be explained in greater detail below.

In one illustrative embodiment, dielectric layer 40 is formed of an organo silical based material. Examples include tetramethylsilane (aka 4MS), trimethylsilane (aka 3MS) and octamethylcyclotetrasiloxane (aka OMCTS) with $O_2$. The thickness of the layer is a function of the minimum feature size (i.e., technology node) and the particular application to which the present invention is directed. An illustrative dielectric layer thickness would be in the range of around 1800 to 3000 Angstroms for a typical single damascene metal one layer. For a dual damascene metal layer, an illustrative dielectric layer would be in the range of perhaps around 4000 to 8000 Angstroms. The permittivity constant of the layer varies across the thickness of the layer. For instance, in one illustrative embodiment, the permittivity may vary from about 3.0 at the bottommost region to about 2.0 at the middle region and back to about 3.0 at the topmost region. This gradation of permittivity is accomplished by careful control over the deposition parameters. In the first illustrative embodiment, the layer is deposited by chemical vapor deposition (CVD) techniques. Control over the permittivity value is preferably accomplished by either plasma treating the deposited film or by adjusting the silane:$O_2$ ratio during deposition.

In a first example, an organo silane material such as a 4MS film is deposited by CVD at a pressure preferably of about 2-6 torr and more preferably at about 3-5 torr, and a temperature of about 30 to 450 C and more preferably of about 30-250 C to deposit a dielectric layer. A mixture of oxygen and silane is flowed into the CVD chamber to form the film. Preferably, the flow rate of silane is about 200 to 1500 sccm (more preferably about 250 sccm for a 4MS film) and the flow rate of oxygen is about 400 to 1500 sccm (more preferably about 600 sccm for a 4MS film) at the beginning of the film deposition. The relative flow rates are then gradually adjusted to achieve the desired gradation of density and permittivity. For instance, in one embodiment of depositing a 4MS film, the flow rate of 4MS to oxygen might be adjusted from about 0.4 at the lower portion of the film (providing a permittivity of about 2.8) to about 0.8 at the upper portion of the film (providing a permittivity of about 2.5).

In another example, the permittivity is varied over the film deposition process by varying the deposition chamber pressure while keeping the relative flow rates substantially constant. As an example, the relative flow rate of 4MS to oxygen may be held at about 0.4, while gradually increasing the pressure from about 3T to about 5T. Under such circumstances, the resulting film will have a permittivity that varies across its thickness from about 2.8 to about 2.6.

In another embodiment, the film permittivity is adjusted by a post-deposition plasma treatment. Plasma treatment will cause the as-deposited film to densify, thus increasing its permittivity. This densification phenomenon will be greatest at the top surface of the film, and the impact of the plasma treatment will gradually, and substantially continuously, decrease over the thickness of the film as one progresses from the top to the bottom.

In one example, IMD layer 36 is formed by flowing 4MS and oxygen to form the layer, which layer is subjected to an $H_2$ plasma. The plasma is preferably generated at about 250 to 400 C and a pressure of about 4T. For a layer of about 6,000 Angstroms thickness, a plasma treatment of about 30 seconds to about 5 minutes should suffice to provide a sufficient permittivity gradient substantially throughout the film thickness. In the provided example, the permittivity of the material will typically range from about 2.2 to about 3.5 after the treatment.

While the CVD process has been described as separate from the plasma treatment process, one skilled in the art will recognize that in some embodiments, both the gas flow ratio can be adjusted during film deposition and the film can be subjected to a post-deposition plasma treatment to achieve the desired permittivity gradient.

The above described deposition techniques allow for control over the density of the resulting dielectric layer. As is known in the art, a more dense layer has a higher permittivity (which is less desirable for a low k dielectric material), but has better mechanical properties. Contrawise, as the layer becomes less dense, the permittivity characteristics improve, but at the expense of lower mechanical strength, adhesion strength, and the like. Film density is a result of the film porosity and/or the concentration of one or more components of the film (e.g., oxygen in the above described embodiments). In some preferred embodiments, the permittivity gradient is obtained by varying the film porosity by at least five percent from the most dense region to the least dense region. The dense region porosity is preferably less than about ten percent porosity (to maintain acceptable film quality) and the dense region of the film is preferably at least about five percent of the total film thickness. This gradient in film porosity can be obtained, e.g., by a plasma treatment as described above.

In other preferred embodiments, film density is controlled by controlling the concentration of a constituent component, such as the amount of oxygen in the film. In preferred embodiments, the percentage of oxygen varies by at least about three percent, and more preferably by about ten percent. This concentration gradient can be obtained, e.g., by adjusting the silane/oxygen flow ratios as described above. In yet other preferred embodiments, the permittivity gradient is obtained by a change in both the porosity of the film and the concentration of a constituent element. In such embodiments, the porosity varies by at least about five percent and the concentration gradient varies by at least about three percent.

Figure 4A:
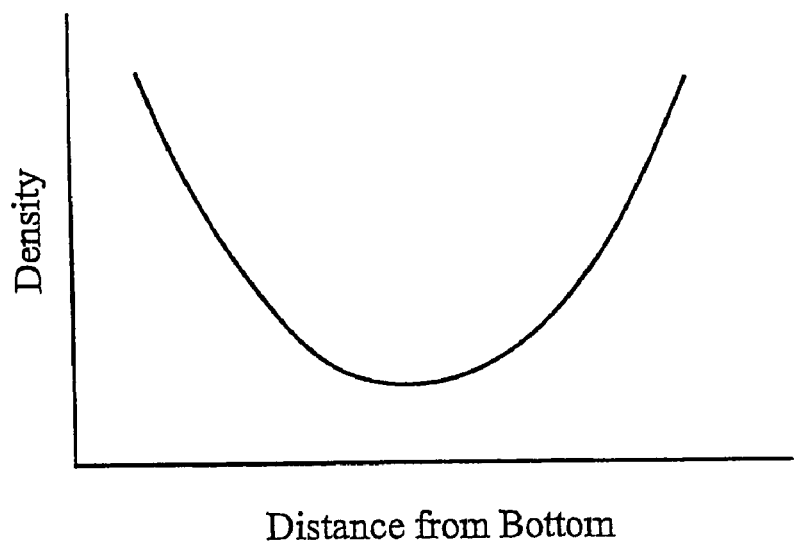
FIGS. 4a and 4b illustrate a density profile of alternate illustrative embodiment dielectric layers.
Figure 4B:
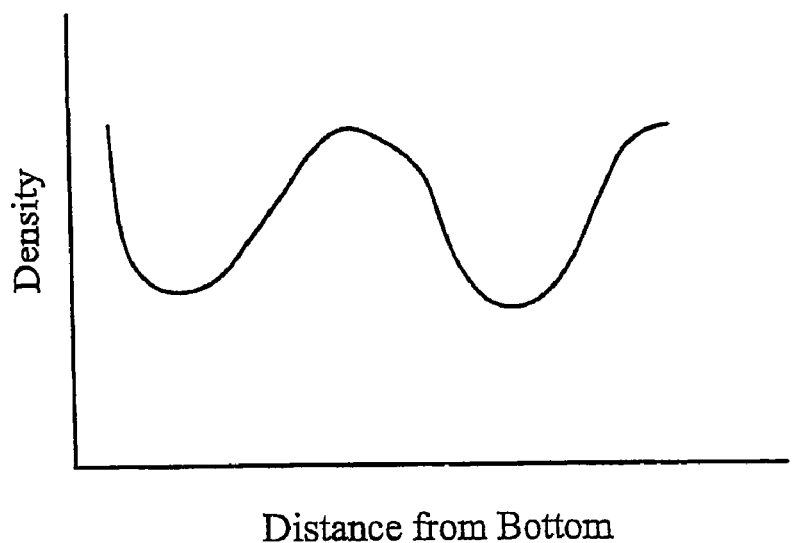

As illustrated in FIG. 3, the dielectric film can be constructed to have a straight-line permittivity profile resulting from a dense region at the top that gradually gives way to a less dense (or a so-called loose) region at the bottom. FIG. 4a illustrates another illustrative embodiment in which the density (and hence permittivity) of the dielectric film is controlled to provide a dense region at the top and bottom portions of the film along with a less dense (and hence lower permittivity) region in the middle portion of the film. Such an embodiment might be useful, for instance, to provide a top and bottom portion having good mechanical strength and adhesion characteristics, while the middle portion of the film, which may constitute the majority of the film thickness, would provide for the desired low permittivity characteristics. FIG. 4b illustrates yet another illustrative embodiment in which the film density varies in a substantially sinusoidal manner from dense to loose to dense to loose to dense throughout the film thickness. It is believed that such a manner of varying density could provide for advantageous features of the film such as providing for a film having good adhesion to underlying or overlying layers (where the film is dense) while also providing for reduced parasitic capacitance because of the lower permittivity in the regions where the film is loose. The sinusoidal profile could contemplate a situation where an etch stop layer (requiring a dense film region for good adhesion) is located at some middle region of the overall intermetal dielectric layer. One skilled in the art will recognize that numerous variations on the density/porosity profile can be obtained be varying the plasma treatment and the gas ratio process described above. Other processes might also be employed to vary either the film porosity, the concentration of a constituent element, or both. Such other processes might include curing of the deposited dielectric film, such as by thermal curing, E-beam curing, UV curing, and the like.

Figure 5:
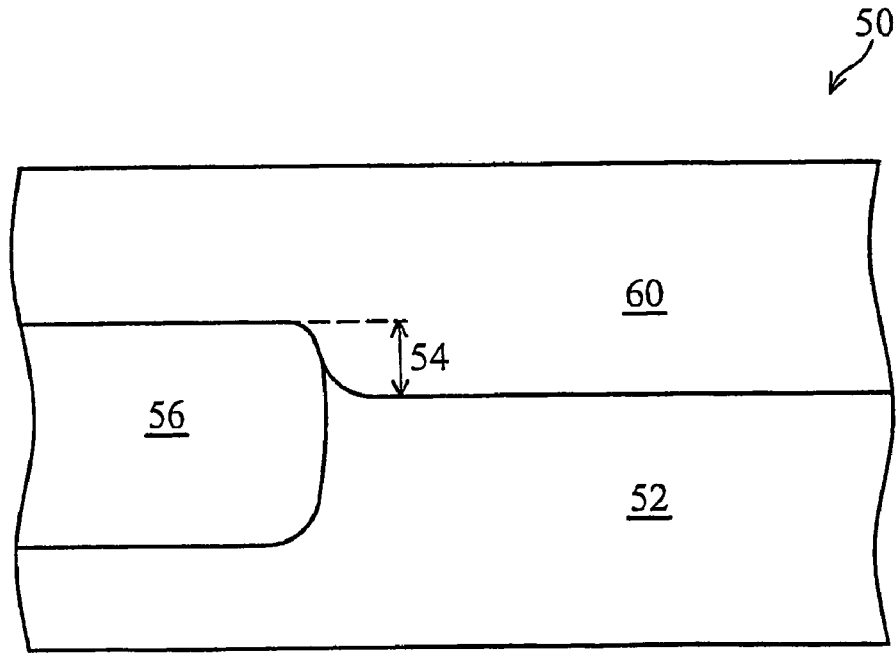
FIG. 5 illustrates an illustrative embodiment dielectric layer having good step coverage.

FIG. 5 illustrates yet another illustrative embodiment of the present invention. As shown in a highly exaggerated form, device 50 includes a substrate 52 (which may be a previously formed dielectric, interconnect, etch stop layer, or the like) which has formed therein a step. Step 54 could result from the presence of a structure 56, such as an interconnect structure. While structure 56 is shown having been formed within substrate 52, in other embodiments, structure 56 may be a feature that was formed prior to the formation of substrate 52 and which resulted in a non-planar (or an imperfectly planar) top surface to substrate 52. In a typical embodiment, the step 54 height may be as great as around 200 Angstroms. As is well known in the art, step coverage is an important property of a dielectric, such as IMD 60, which, as shown in FIG. 5, is formed over substrate 52, including over step 54. An advantageous feature of the present embodiment is the ability to adjust the IMD density characteristics to improve step coverage performance, while at the same time allowing for the remaining IMD layer (or at least portions of it) to be adjusted to provide for improved electrical/permittivity characteristics.

The illustrative embodiments have been described with reference to a dielectric material formed of 4MS. One skilled in the art will realize that the above teachings would apply to other materials as well, including silicon based organic or inorganic materials, organic polymers, organic-inorganic hybrid materials, and combinations thereof.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a dielectric layer comprising:
    providing a substrate;
    beginning a chemical vapor deposition of a dielectric material on the substrate by introducing at least two gases to the substrate; and
    varying the flow rate ratio of the at least two gases during deposition of said dielectric material so as to substantially uniformly vary the concentration of at least one of said at least two gases in the resulting dielectric layer, wherein the resulting dielectric layer has a substantially continuously variable permittivity.

2. The method of claim 1 wherein the dielectric layer comprises tetramethylsilane (4MS).

3. The method of claim 1 wherein said at least two gases are alkyl silane and oxygen.

4. The method of claim 1 wherein said flow rate ratio is varied from about 0.4 to about 0.8.

5. The method of claim 1 further comprising exposing the dielectric layer to a plasma treatment.

6. The method of claim 1 wherein said flow rate ratio is varied to cause the dielectric layer to have at least one dense region and at least one loose region.

* * * * *